(12) United States Patent
Lin

(10) Patent No.: US 6,306,749 B1
(45) Date of Patent: Oct. 23, 2001

(54) BOND PAD WITH PAD EDGE STRENGTHENING STRUCTURE

(75) Inventor: Shi-Tron Lin, Hsinchu (TW)

(73) Assignee: Winbond Electronics Corp, Hsinchu (TW)

( * ) Notice: Subject to any disclaimer, the term of this patent is extended or adjusted under 35 U.S.C. 154(b) by 0 days.

(21) Appl. No.: 09/327,874

(22) Filed: Jun. 8, 1999

(51) Int. Cl.[7] ............... H01L 21/4763; H01L 23/48; H01L 23/52; H01L 29/40
(52) U.S. Cl. ............... 438/612; 438/622; 438/637; 257/779
(58) Field of Search ................... 438/597, 612, 438/926, 622, 637; 257/779

(56) References Cited

U.S. PATENT DOCUMENTS 4,060,828 * 11/1977 Satonaka .................. 357/71
6,027,999 * 9/1998 Wong .................... 438/637

\* cited by examiner

Primary Examiner—Charles Bowers
Assistant Examiner—Nema Berezny

(74) Attorney, Agent, or Firm—W. Wayne Liauh

(57) ABSTRACT

A bond pad structure for use in wire bonding application during the packaging operation of semiconductor devices which contains a bond frame structure for holding the bond pad in place to prevent bond pad peel-off problem. The bond pad structure is a laminated structure containing a top dielectric layer, a metal bond pad layer, a middle dielectric layer, and an underlying layer formed above a wafer surface. The bond frame structure, which is formed in a spaced apart relationship from the metal bond pad layer contains a plurality of island elements formed on top of the middle dielectric layer and an interconnected frame element formed on top of the top dielectric layer. The frame element contains a portion which overlaps with a portion of the metal bond pad layer, so as to exert a downward force to prevent the metal bond pad layer from peeling off. Each of the island elements is respectively connected to the underlying layer and the frame element by one or a plurality of hole-fills, which can contain an appropriate hole-material such as tungsten plus or can be filled with the same material constituting the layer overlaying them. The underlying layer can be a metal layer, a semiconductor layer such as a polysilicon layer, or any material layer which has good adhesion with the hole fill material.

10 Claims, 5 Drawing Sheets

BOND PAD WITH PAD EDGE STRENGTHENING STRUCTURE

FIELD OF THE INVENTION

The present invention relates to a novel bond-pad structure for use in semiconductor packaging applications with improved stability so as to increase production yields. More specifically, the present invention relates to a novel bond-pad structure which eliminates or at least minimizes the bond-pad "lift-off" (or "peeling-off") problems often encountered during the wire bonding step in the packaging of integrated circuits (ICs). With the novel bond-pad structure of the present invention, the failure rate in production yield due to the bond-pad lift-off problem can be substantially reduced using existing technology and without requiring major modifications in the fabrication process or facility. The present invention also relates to a novel process which implements the improved bond-pad design to increase the production yield so as to reduce the overall production cost for the manufacturing of integrated circuit packages, as well as to the printed circuit boards (PCBs) or other integrated circuit packages that incorporate the novel bond-pad structure disclosed herein.

BACKGROUND OF THE INVENTION

During the formation of printed circuit boards (PCBs) or other integrated circuit (IC) packaging processes, the semiconductor devices provided in the printed circuit board can be respectively connected to the outside via a wire-bonding process. In such a process, one or more bonding pads are provided which are in contact with respective parts of the semiconductive device at the outer-most conductive layer thereof. Then, a bonding wire is bonded onto the bond pad so as to allow the semiconductor device to make electric contact with the inner lead of the IC package. More than one layer of bond pads can be provided at the same location, each being connected to a respective conductive layer on the wafer.

FIG. 1 is a cross-sectional view showing a typical bond pad structure and how the metal bond pad is positioned relative to other layers in a multi-layered semiconductor device on a wafer surface. Typically, a metal layer (metal-1) is deposited on top of a dielectric layer (dielectric-1), then another dielectric layer (dielectric-2) is formed on the metal layer. Finally a third dielectric layer (dielectric-3) is deposited on the dielectric-2 layer using a photolithography technique leaving a bond pad window, within which the metal bond pad layer is deposited. A chemically resistant sealing material (such as polyimide) can be deposited on top of the dielectric-3 layer to form a passivation layer, which provides improved resistance against moisture, contamination, etc. The passivation layer is then etched with photolithography process to expose the pad opening. This completes the most basic bond-pad formation procedure, and the bond pad structure is now ready for being connected to a bonding wire. One or more conductive structures can be formed inside the dielectric-2 layer to provide electrical connection between the metal bond pad and the metal-1 layer. On the other hand, the bond pad does not have to be placed directly above a conductive layer; it can be connected to a conductive layer by a conductive lead. However, this part of the bond pad formation is well known in the art and is thus omitted.

The bond peel-off problem occurs when the adhesion force between the metal bond pad and the dielectric-2 layer is not strong enough to resist the thermal and mechanical stress that may be present during the wire bonding process to bond the bonding wire to the bond pad. This can also occur between any adjacent layers, for example, between the metal bond pad and an underlying polysilicon layer, between a metal layer and a dielectric layer, between a dielectric layer and a polysilicon layer, and between a barrier layer and a dielectric layer, etc. With the dimension of the semiconductor devices becoming increasingly smaller, the bond-pad peel-off problem becomes substantially more profound, and has become a major factor in holding back further progress in increasing production yields.

FIG. 2 shows the cross-section of a prior art bond pad structure designed to improve the stability of the bond pad by minimizing the lift-off problem. A contact, i.e., a via, is formed within the dielectric-2 layer which is filled with a metal material to form a metal bond pad and is in contact with the underlying metal-1 layer. FIG. 2 also shows that a small overhang is also formed which extends from the bond pad and deposited on top of the dielectric-2 layer. The metal-1 layer can be a metal layer or a polysilicon layer. Typically, the underlying layer has good adhesive characteristic with the metal layer, and the large contact surface provided by the formation of the via provides a substantially enhanced adhesion. However, under the high thermal and/or vibrational stress encountered during the wire bonding process, cracks can be formed in the portion of the dielectric-2 layer underlying the overhang. Once the crack is formed, it can propagate along the interface between the metal bond pad and the dielectric-2 layer, thus causing the bond pad peeling-off to occur.

Typically, the wire bonding process can be approximately categorized into two main types: the gold wire/gold ball bonding process and the aluminum wire wedge bonding process. The aluminum wire wedge bonding process is widely used in chip-on-board (COB) applications in which the aluminum wire is welded to the bond pad via a combination of ultrasonic vibrations and pressure applied to the wedge. The gold wire/gold ball bonding process is typically accomplished by pressing the wire, which is first formed into a ball, against the bond pad at an elevated temperature. The aluminum wire wedge bonding process is generally less accurate in establishing the bonding position and less uniform in the applied bonding pressure, and, hence, it is more prone to the bond peel-off problem relative to the gold wire/ball bonding process, mainly due to the non-uniformity of mechanical and/or thermal stresses.

FIG. 3 shows the cross-section of another prior art improved bond pad structure, in which a plurality of anchors are formed inside the dielectric-2 layer connecting the metal bond pad and the metal-1 layer. The anchors provided newly increased horizontally contacting surface with the metal-1 layer, and vertically contacting surface with the dielectric-2 layer. Both can contribute to an increased adhesion force and increased stability of the metal bond pad.

Bond-pad peeling-off or lift-off has been a major unsettling problem besetting the integrated circuit packaging industry involving the wire bonding technology. Many possible solutions have been suggested and implemented, as illustrated in the following prior art references.

U.S. Pat. No. 4,060,828 discloses a semiconductor device having a multi-layer wiring structure with an additional through-hole interconnection formed in the insulating layer beneath the bonding pad of the wiring layer. The purpose of the '828 patent is to provide additional, and protected, electrical contact between the bonding pad and another wiring layer therebelow, such that if the exposed portion of the bonding pad is corroded and thus becoming disconnected, the additional electrical contact formed through the insulation layer can still provide the needed connection. While the '828 patent does not directly address the bond pad peel-off problem, the concept of providing a through-hole interconnection structure in the insulation layer immediately underlying the metal layer as disclosed in the '828 patent has been adopted, though mostly in modified form, by essentially all the prior art processes dealing with solving the problem of bond pad peel-off to provide an anchored structure.

U.S. Pat. No. 4,981,061 discloses a semiconductor device which comprises a first insulating layer formed on the major surface of the semiconductor substrate including an active region. A first contact hole is formed at a position in the first insulating layer corresponding to the active region and a first conductive layer is formed in the first contact hole and a portion of the first insulating layer around the contact hole. Then a second insulating layer is formed on the first conductive layer and the first insulating layer, and a second contact hole is formed at a position in the second insulating layer corresponding to the first conductive layer and located above the first contact hole. Subsequently, a second conductive layer is formed on the second insulating layer and fills the second contact hole. Finally a bonding wire is connected to the second conductive layer in regions located above the first and second contact holes. With the structure disclosed in the '061 patent, the pressure applied to the second insulating layer during wire bonding is supported by columnar portions of the first and second conductive layers filled in the first and second contact holes. Thus, the pressure acting on the second insulating layer is reduced to suppress occurrence of cracks.

U.S. Pat. No. 5,309,205 discloses a bond pad structure which is formed by depositing a barrier layer over an underlying region of a semiconductor device, and then depositing a first conductive layer over the barrier layer. The barrier layer and conductive layer are then patterned and etched to define a conductive region. In the '205 patent, the conductive region is formed in the shape of a grid, and a second conductive layer is deposited over the conductive region and a portion of the exposed underlying region. The second conductive layer makes a good adhesive contact with the underlying region, thus preventing bond pad lift off.

U.S. Pat. Nos. 5,248,903 and 5,284,797 disclose a bond pad structure which alleviates bond pad lift problems encountered during wire bonding by providing a composite bond pad, which includes an upper bond pad and a lower bond pad, and an insulating component therebetween. At least one opening is provided through the insulating component, extending from the bottom bond pad to the upper bond pad. The at least one opening is aligned with a peripheral region of the bottom bond pad. A conductive material is then provided which fills the plurality of openings, and electrically connects the top and bottom bond pads. The at least one opening can be a plurality of conductive vias, a ring-like opening extending around the peripheral region, or one or more elongated slit-like openings. The need to form the upper and lower bond pads in a single bond pad structure can substantially increase the production cost.

U.S. Pat. No. 5,309,025 discloses an improved bond pad structure which reduces bond pad lift off problems. The bond pad disclosed in the '025 patent includes a barrier layer, and is formed by first depositing a barrier layer over an underlying region of a semiconductor device, and then depositing a first conductive layer over the barrier layer. The barrier layer and the conductive layer are then patterned and etched to define a conductive region. A plurality of the conductive regions are formed each of which is isolated from the ourside by the formation of an insulative sidewall. A second conductive layer is deposited over the conductive region and a portion of the exposed underlying region. The second conductive layer makes a good adhesive contact with the underlying region, thus preventing bond pad lift off.

U.S. Pat. No. 5,707,894 discloses an improved bonding pad structure and the process for forming the same which reduces the bond pad peeling problem between the bonding pad layer and an underlying layer. The method disclosed in the '894 patent comprises the steps of first forming a plurality of anchor pads on the substrate surface in the bonding pad area. Next, a first insulating layer is formed over the substrate surface and the anchor pads. A plurality of via holes are formed through the first insulating layer which are filled with the same material as a second metal layer, which covers the first insulation layer, so as to form a conductive connection anchor pads and the second metal layer. The via holes have a smaller cross-sectional area than the anchor pads so that the combination of the anchor pads and the second metal form small "hooks" into the first insulating layer that hold the second metal layer (i.e., the bonding pad layer) to the underlying layer.

There are advantages and disadvantages of using the inventions described above. However, in light of the ever-present urgency to reduce production cost in a highly competitive semiconductors market, it is almost imperative to explore other options, which may work alone or additively to the existing techniques, to further ensure the absence of bond pad peel-off problem and improve production yields.

SUMMARY OF THE INVENTION

The primary object of the present invention is to develop an improved bond pad structure for use in wire bonding applications during the packaging operation of integrated circuit devices. More specifically, the primary object of the present invention is to develop an alternative bond pad structure which minimizes the lift-off problem without requiring the use of any of the anchoring techniques suggested in the prior art, so as to avoid the new problems introduced therewith. However, the technology developed in the present invention can also be used in conjunction with several of the prior art techniques, if this is so desired by the manufacturer.

In the novel bond pad structure of the present invention, a bond frame is provided which tends to hold the metal bond pad in place from being lifted up or peeled off, in a manner similar to a picture frame holds a picture. Preferably a plurality of bond frames are provided along one edge of a plurality of edges, either partially or completely, of the bond pad. The bond frame comprises an island element in the metal bond pad layer but is isolated from the bond pad, and a frame element deposited on top of the dielectric-3 layer. The frame element should extend to cover a portion of the bond pad so as to provide a "framing" effect, to exert a downward force against the bond pad. The island element and the frame element are connected through one or more hole fills (or vias). The island element is also connected to the metal-1 layer via one or more hold fills (or contacts). The metal-1 layer does not have to be a metal layer, it can be a polysilicon layer, or a dielectric layer that has a good adhesion with the hole fill material. Examples of the hole fill can be tungsten plugs, or direct fills of the material that forms the overlaying layer, which can be the frame layer or the island layer, or the metal bond pad layer. If different material such as tungsten plug is used in forming the hole fill, an additional step is required. On the other hand, if the same material from the overlaying (i.e., bond pad) layer is used in forming the hole file, it can typically formed in the same step as forming (by depositing) the overlaying layer.

It should be noted that, as discussed above, the so-designated "metal-1" layer does not have to be a metal layer, because the bond pad can be connected to a conductive layer of the wafer that is not disposed directly below the bond pad, although for design purposes, it is convenient to provide a conductive metal layer directly below the bond pad layer. Since the bond pad can be connected to other conductive layer not directly beneath it, the polysilicon layer, if it is used in place of the so-called "metal-1" layer, can be conductive or it can be non-conductive.

An anchoring structure can be provided underneath the metal bond pad to provide enhanced adhesion. Preferably, the single anchoring structure with a plurality of interconnected line segments as disclosed in a co-pending application by the same inventors is utilized.

In another preferred embodiment of the present invention, the island elements are made in the shape of elongated rectangle, and each pair of island elements are separated by a similar elongated rectangle extending from the bond pad.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

The present invention discloses an improved bond pad structure for use in wire bonding applications during the packaging operation of integrated circuit devices. In the novel bond pad structure of the present invention, a bond frame is provided to hold the metal bond pad in place from being lifted up or peeled off, in a manner similar to a picture frame holds a picture. The bond frame comprises an island element in the metal bond pad layer but is isolated from the bond pad, and a frame element deposited on top of the dielectric-3 layer. The frame element should extend to cover a portion of the bond pad so as to provide a "framing" effect. The island element and the frame element are connected through one or more hole fills (or vias). And the island element and the metal-1 layer are connected through one or more hold fills (or contacts). The metal-1 layer can be replaced with a polysilicon layer, or even an insulative layer that has a good adhesion with the hole fill material. Preferably a plurality of bond frames are provided, either partially or completely, along one edge of a plurality of edges of the bond pad.

Figure 1:
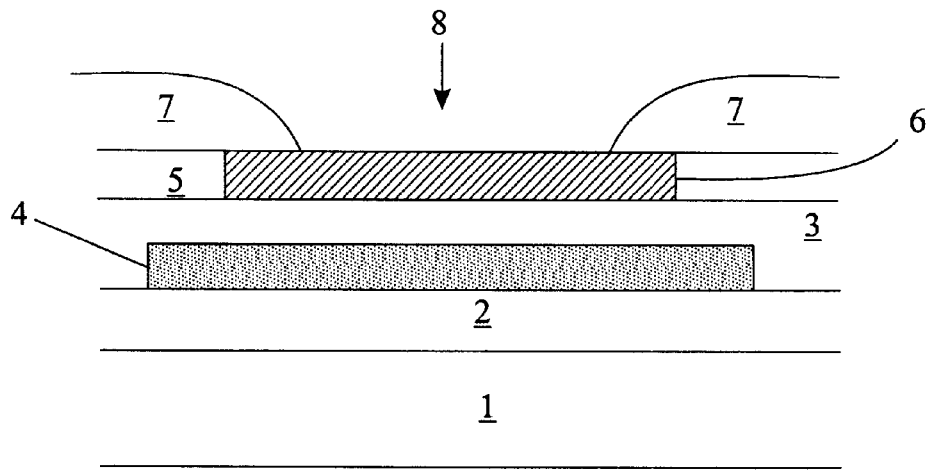
FIG. 1 is an illustrative schematic side view showing a typical bond pad structure and how the metal bond pad is positioned relative to other layers in a multi-layered semiconductor device on a wafer surface.

Now referring to the drawings. FIG. 1 is a side view showing an unimproved conventional bond pad structure and how the metal bond pad is positioned relative to other layers in a multi-layered, or laminated, semiconductor device on a wafer surface. Typically, a metal layer 4 (which is also referred to as the "metal-1"layer) is deposited on top of a dielectric layer 2 (which is also referred to as the "dielectric-1", or "bottom dielectric," layer), then another dielectric layer 3 (which also referred to as the "dielectric-2", or "middle dielectric," layer) is formed on the metal-1 layer 4. The metal-1 layer 4 can also be referred to as the level-1 layer, as it can be made of a non-metal material, which can be a semiconductor or dielectric material.

Finally a third dielectric layer 6 (which is also referred to as the "dielectric-3", or "top dielectric," layer) is deposited on the dielectric-2 layer 3 using a photolithography technique leaving a bond pad window, within which the metal bond pad layer 5 (which is also referred as the "metal-2", or "level 2," layer) is deposited. Optionally, a chemically resistant sealing material (such as polyimide) can be deposited on top of the dielectric-3 layer 5 to form a passivation layer 7, which provides improved resistance against moisture, contamination, etc. The passivation layer 7 is then etched with photolithography process to expose the pad opening 8. This completes the most basic bond-pad formation process, and the bond pad structure is now ready for being connected to a bonding wire. One or more conductive filled-holes (not shown) can be formed inside the dielectric-2 layer to provide electrical connection between the metal bond pad and the metal-1 layer. However, this part of the bond pad formation is well known in the art and is thus omitted in the drawings.

Figure 2:
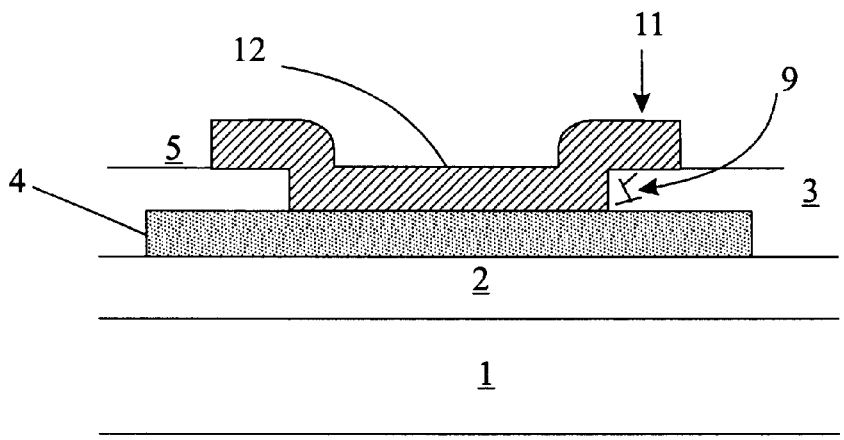
FIG. 2 is an illustrative schematic side view of a prior art bond pad structure designed to improve the stability of the bond pad by minimizing the lift-off problem by forming the bond pad in the form of a via which is in direct contact with the metal layer.

FIG. 2 shows a side view of a prior art bond pad structure designed to improve the stability of the bond pad by minimizing the bond pad lift-off problem. As shown in FIG. 2, a contact, i.e., a via 12, is formed within the dielectric-2 layer which is filled with the metal-2 material as part of the level-1 layer to form the bond pad open area which is in contact with the underlying level-1 layer. Each of the level-1 or level-2 layer can be a metal or semiconductor (for example, polysilicon) material. This can be a M2-via-M1 structure or a M2-contact-polysilicon structure. M1 indicates a first metal and M2 indicates a second metal; they can be the same or different.

FIG. 2 also shows that an overhang portion 11 is also formed which extends from the bond pad open area and is deposited on top of the dielectric-2 layer. As described above the level-1 layer can be a metal layer or a polysilicon layer. Typically, the underlying layer (level-1 layer) has good adhesive characteristic with the level-2 layer, and the large contact surface provided by the formation of the via provides a substantially enhanced adhesion. However, under the high thermal and/or vibrational stress encountered during the wire bonding process, cracks 9 can be formed in the portion of the dielectric-2 layer underlying the overhang 11. Once the crack is formed, it can propagate along the interface between the metal bond pad and the dielectric-2 layer, thus causing the bond pad peeling-off to occur.

Figure 3:
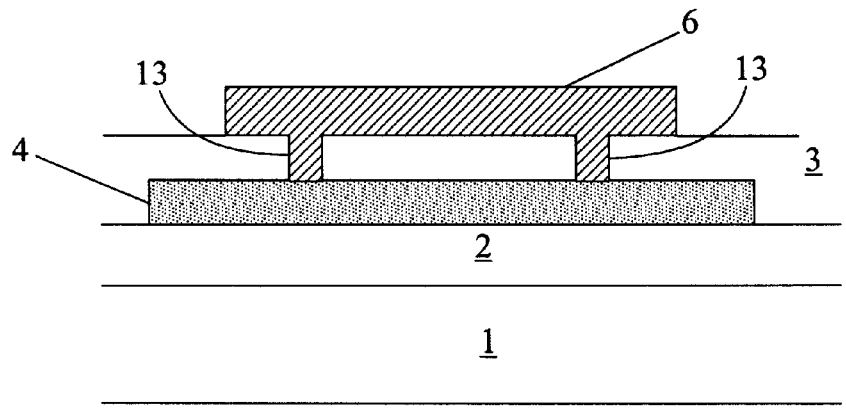
FIG. 3 is an illustrative schematic side view of another prior art improved bond pad structure, in which a plurality of anchors are formed inside the dielectric-2 layer connecting the metal bond pad and the metal-1 layer.

FIG. 3 shows the cross-section of another prior art improved bond pad structure, in which a plurality of anchors 13 are formed inside the dielectric-2 layer 3 connecting the metal bond pad 6 and the metal-1 layer 4. The plurality of anchors 13 provide newly increased horizontally contacting surface with the metal-1 layer 4, as well as extra vertically contacting surface with the dielectric-2 layer 3. Both can contribute to an increased adhesion force and increased stability of the metal bond pad.

The bond frame of the present invention also allows an anchoring structure to be provided underneath the metal bond pad to provide an enhanced adhesion. Preferably, the single anchoring structure comprising a plurality of interconnected line segments as disclosed in a co-pending application by the same inventors is utilized. In one preferred embodiment of the present invention, the island elements are made in the shape like a square and are surrounded by the metal bond pad. In another preferred embodiment of the present invention, the island elements are made in the shape of elongated rectangle, and each pair of island elements are separated by a similar elongated rectangle extending from the bond pad.

One of the advantages of the bond frame structure of the present invention is that it can be implemented in a wide range of configurations. To illustrate such flexibility, the present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

Figure 4:
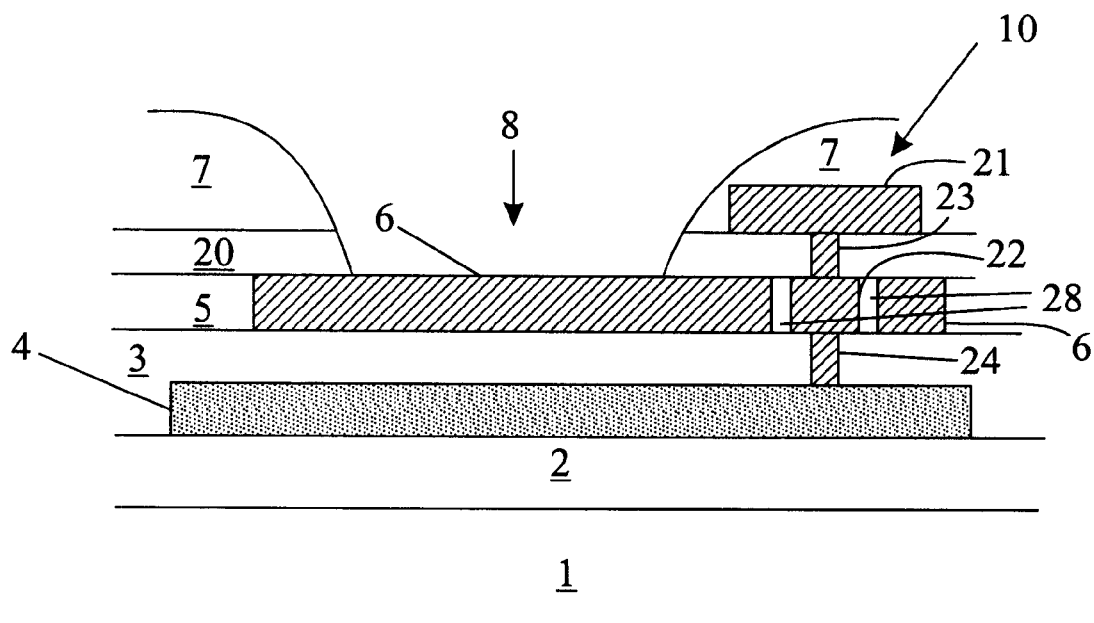
FIG. 4 is an illustrative schematic side view showing the bond frame according the first preferred embodiment of the present invention.

FIG. 4 is an illustrative schematic side view showing the bond pad structure according the first preferred embodiment of the present invention. The metal bond pad layer 6 (or Level-2 ) is positioned above the metal-1 layer 4 (or Level-1), separated by a dielectric-2 layer 3. The metal-1 layer 4 is deposited on a dielectric-1 layer 2, which is deposited or grown on a substrate 1. FIG. 4 also shows that the frame element 21 is formed on top of the dielectric-3 layer. Finally, a passivation is deposited on the entire wafer surface, and a bond pad open window 8 is formed by a photolithography process. The presence of the frame element 21 above the bond pad exerts a framing, or straining, effect on the bond pad, thus preventing the bond pad from being lifted off from the dielectric layer.

The bond frame 10 of the present invention comprises an island element 22, formed in Level-2(i.e., the level where the bond pad layer is situated), and a frame element 21, formed in Level 3 (i.e., one metal level above the bond pad layer 6, or Level-2 ). The island element 22 is isolated from the bond pad 6 by an open area, 28. A hole fill (or contact) 23 is provided to connect the frame element 21 and the island element 22 therebetween. And another hole fill (or via) 24 is provided to connect between the island element 22 and the metal-1 layer. It should be noted that the metal-1 layer can be a non-metal layer, it is so designated for convenience and because this has been the most common situation. The metal-1 layer can be a semiconductor layer, such as polysilicon, or a dielectric layer which provides good adhesion with the metal material to be used in the bond frame structure. In other words, the constituting materials for level-3, level-2 and level-1 can be M2 (second type metal, or metal-2 ), M1 (first type metal, or metal-1), and polysilicon, respectively. Or they can be metal-2 , metal -1 , and metal-3 (M3), respectively. Metal-1, metal-2 , and metal-3 can be the same or different.

In summary, FIG. 4 shows that at least a frame element, formed in a level-3 layer, is connected to a level-1 layer through an opening in the level-2 layer. A level-2 island element, at least partially provided within an opening in the level-2 layer, is connected to both the frame element and the level-1 layer. This constitutes the basic structure of the bond frame of the present invention. The level-3 frame element/ contact/level-2 island element can be a M2/via/M1 structure. And the level-2 island element/contact/level-1 layer combination can be a M2/contact/polysilicon structure. The island element can be positioned adjacent to and along one edge or multiple edges of the bond pad, or at any location of the bond pad. Because the island element is isolated from the bond pad, it is shielded from the mechanical and thermal stress that are applied onto the bond pad during wire bonding operations, thus it can prevent dielectric cracking near the edge portion of the pad bond. In addition, it also firmly holds the bond pad in place, to further prevent bond pad lift-off problems.

EXAMPLE 2

Figure 5:
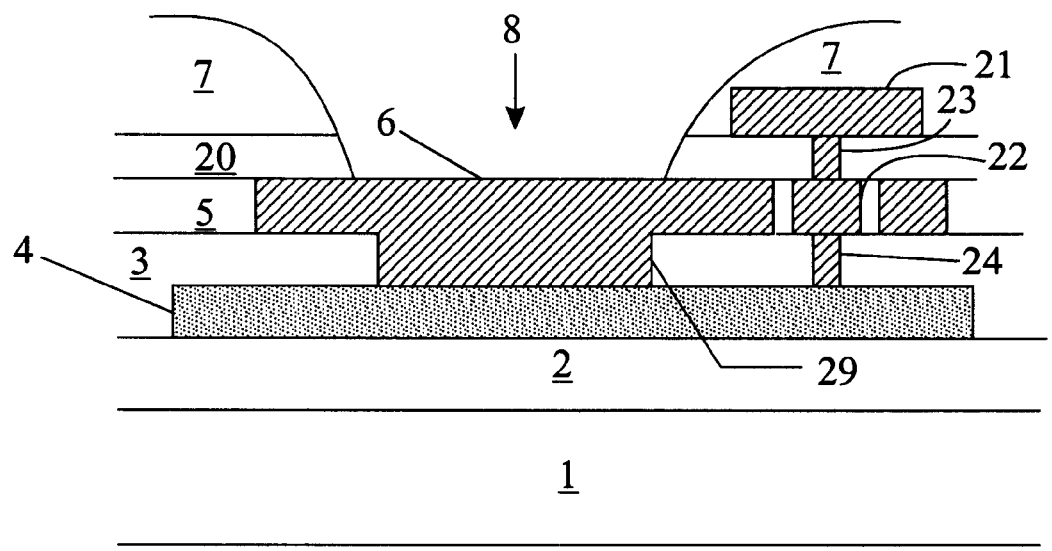
FIG. 5 is an illustrative schematic side view showing the bond frame according the second preferred embodiment of the present invention which contains an anchoring structure connecting the bond pad and the metal-1 layer.

FIG. 5 is an illustrative schematic side view showing the bond pad structure according the second preferred embodiment of the present invention which is very similar to bond pad structure as shown in FIG. 4, except that it contains an anchoring structure connecting the bond pad and the metal-1 layer.

EXAMPLE 3

Figure 6:
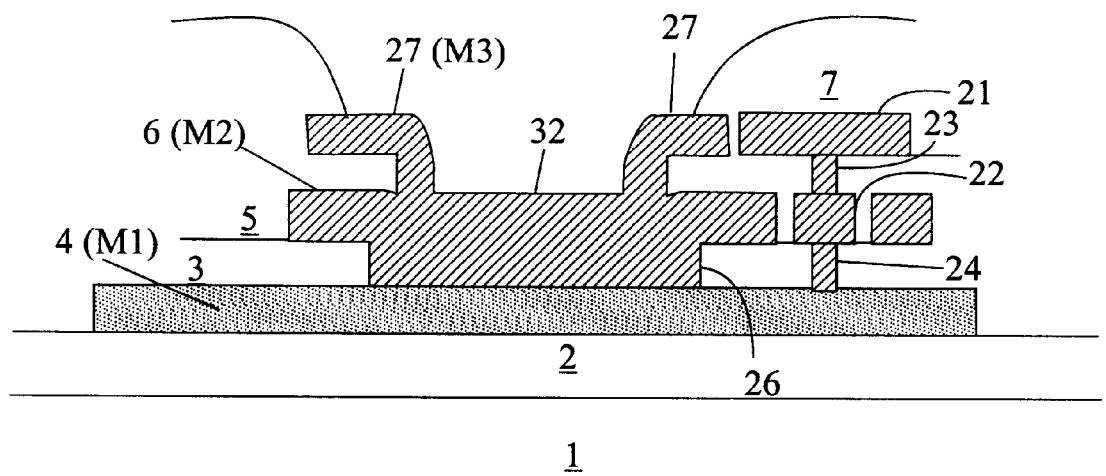
FIG. 6 is an illustrative schematic side view showing the bond frame according the third preferred embodiment of the present invention in which the metal bond pad is formed in the form of a first via which is in direct contact with the metal-1 layer, and the bond pad structure also contains a second via in contact with the first via so as to raise the height of the bond pad.

FIG. 6 is an illustrative schematic side view showing the bond frame according the third preferred embodiment of the present invention in which the metal bond pad 26, which is a part of the M2 structure, is formed in the form of a first via which is in direct contact with the metal-1 layer 4, or M1, and the bond pad structure also contains a M3 structure which includes a second via 32 in direct contact with the first via 26 so as to raise the height of the bond pad.

EXAMPLE 4

Figure 7:
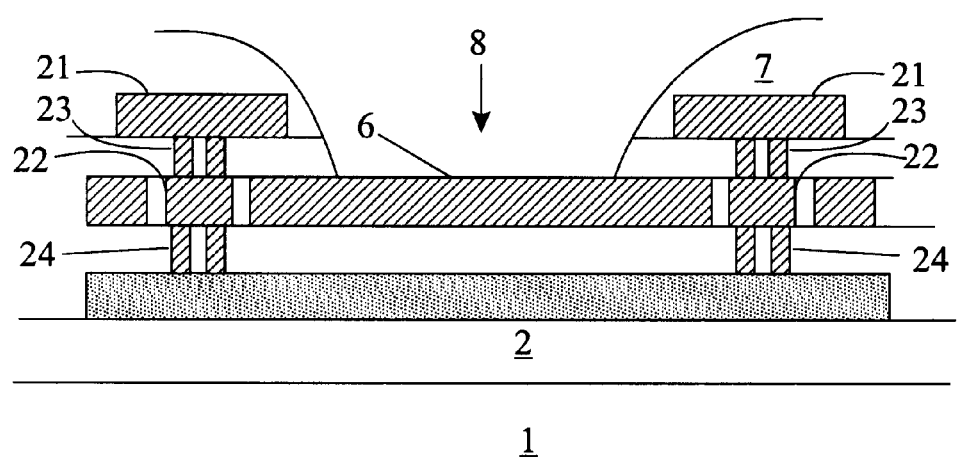
FIG. 7 is an illustrative schematic side view showing the bond frame according the fourth preferred embodiment of the present invention in which multiple hole fills are formed between the island element and the metal-1 layer, and between the island element and the frame element.

FIG. 7 is an illustrative schematic side view showing the bond frame according the fourth preferred embodiment of the present invention in which multiple hole fills 23, 24 are formed between the island element 22 and the metal-1 layer 4, and between the island element 23 and the frame element 21, respectively.

EXAMPLE 5

Figure 8:
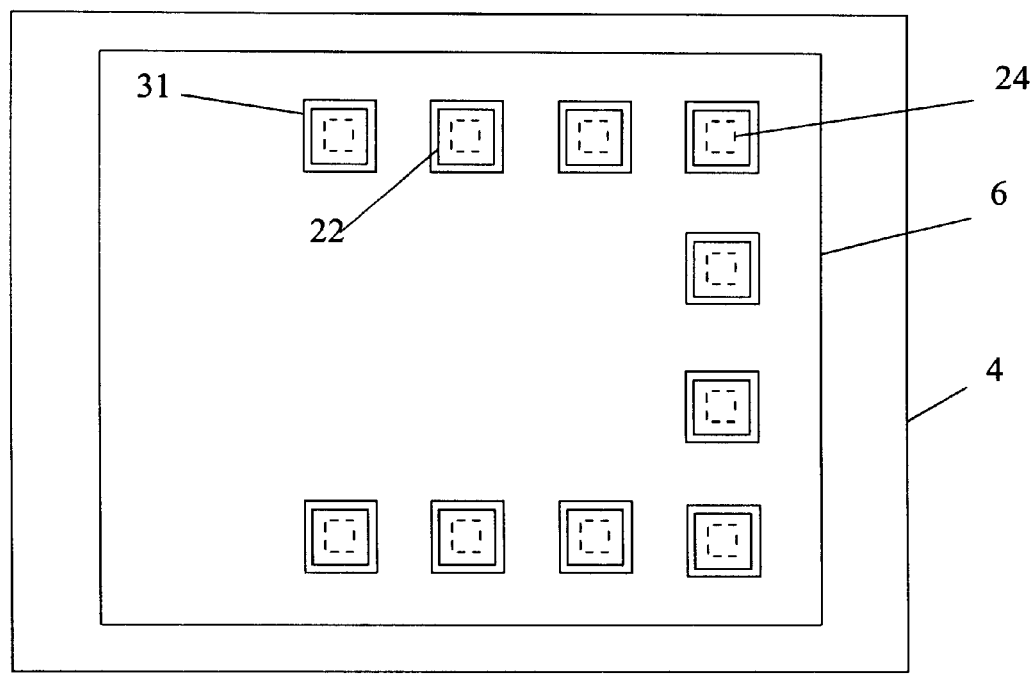
FIG. 8 is an illustrative plan view of the plan encompassing the island element of a bond pad structure of the present invention according to the embodiment shown in FIG. 7 which contains a plurality of bond frames.
Figure 9:
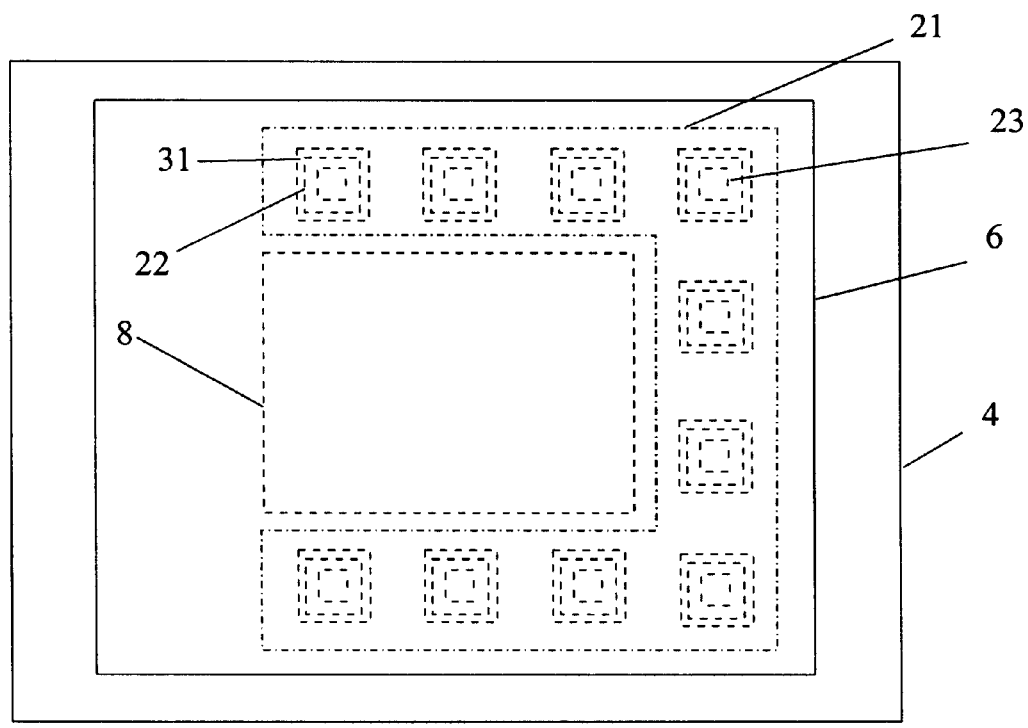
FIG. 9 is an illustrative plan view of the plan encompassing the frame element of a bond pad structure of the present invention according to the embodiment shown in FIG. 7 which also contains a plurality of bond frames.

FIG. 8 is an illustrative plan view of the plan encompassing the island element of a bond pad structure of the present invention according to the embodiment shown in FIG. 7 which contains a plurality of bond frames. As shown in FIG. 9, in order to provide maximum effectiveness, the frame element is formed as a continuous structure.

EXAMPLE 6

FIG. 9 is an illustrative plan view of the plan encompassing the frame element of a bond pad structure of the present invention according to the embodiment shown in FIG. 7 which also contains a plurality of bond frames.

EXAMPLE 7

Figure 10:
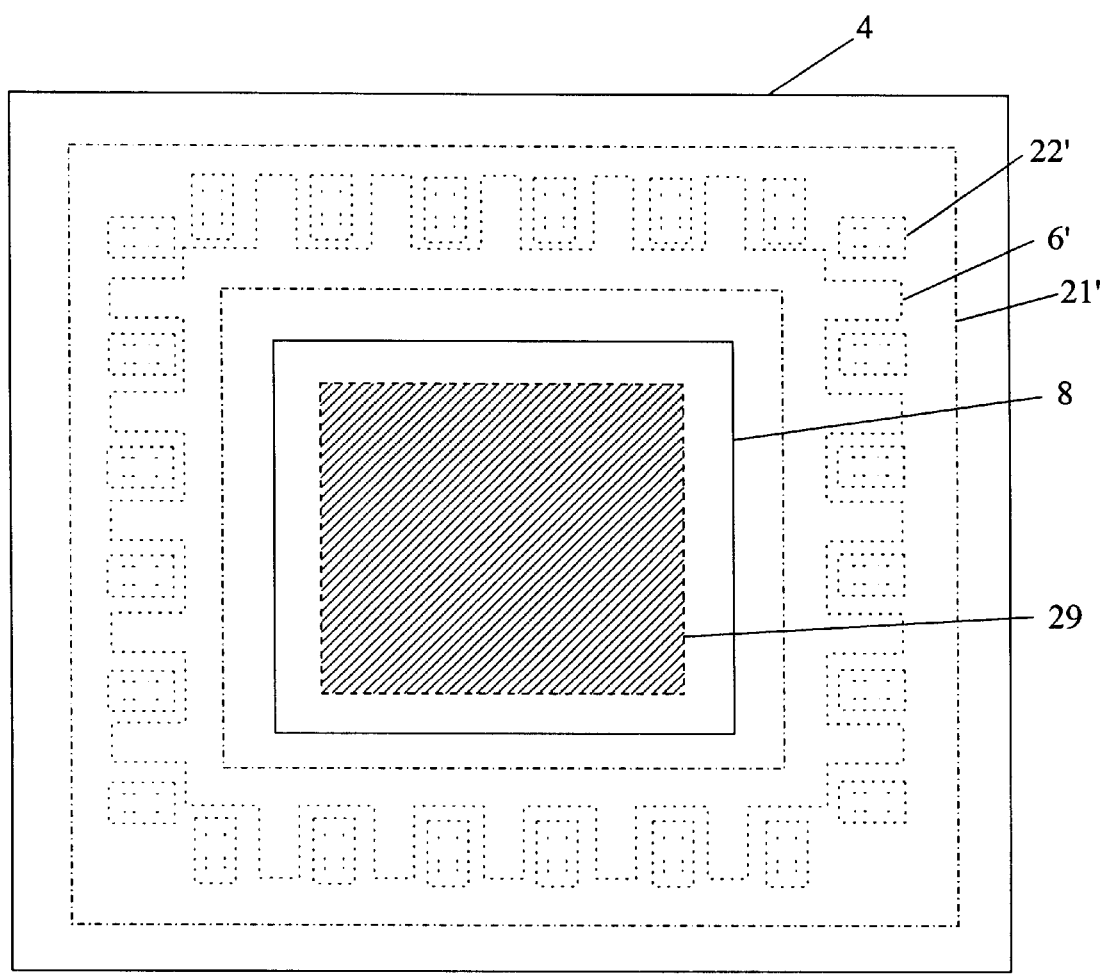
FIG. 10 is an illustrative plan view of the plan encompassing the frame element of a bond pad structure of the present invention according to the embodiment shown in FIG. 7 which contains a plurality of bond frames along the four edges of the bond pad; the bond pad does not enclose the island elements, rather a plurality of bond pad legs are formed which extend between the island elements.

FIG. 10 is an illustrative plan view of the plan encompassing the frame element of a bond pad structure of the present invention according to the embodiment similar to that shown in FIG. 5 which contains a plurality of bond frames along the four edges of the bond pad. In FIG. 10, it is shown that the bond pad 6' does not enclose the island elements 23; rather, a plurality of bond pad legs 32 formed which extend between the island elements. FIG. 10 also shows the anchoring structure 29 beneath the bond pad 6'. Rectangle 33 indicates the boundary of the bond pad open area, after the deposition and a subsequent photolithography process.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for fabricating a bond pad structure for use in an integrated circuit comprising the steps of:
   (a) forming a bottom dielectric layer on a wafer;
   (b) forming an underlying layer on top of said bottom dielectric layer;
   (c) forming a middle dielectric layer on top of said underlying layer, wherein said middle dielectric layer contains at least one first through-hole away from an area intended to form a metal bond pad layer;
   (d) filling said at least one first through-hole with a hole-fill material, and, either simultaneously or subsequently with respect thereof, forming said metal bond pad layer and an island element in said middle dielectric layer, said island element being spaced apart from said metal bond pad layer and in contact with said underlying layer through said filled first through-hole;
   (e) forming a top dielectric layer on top of said metal bond pad layer, wherein said top dielectric layer contains at least one second through-hole which is connected to said island element;
   (f) filling said at least one second through-hole, and, either simultaneously or subsequently with respect thereof, forming at least one frame element on top of said top dielectric vertically above said island element, wherein said island element and said frame element are substantially smaller than said metal bond pad layer, said frame element is formed to contain a portion whose vertical projection overlaps a portion of said metal bond pad layer, and said frame element is connected to said island element through said filled second through-hole.

2. The method for fabricating a bond pad structure according to claim 1, wherein said underlying layer is a metal layer, a polysilicon layer, or a dielectric layer with good adhesion with said a material which fills said first through-hole.

3. The method for fabricating a bond pad structure according to claim 1, wherein said underlying layer is a polysilicon layer.

4. The method for fabricating a bond pad structure according to claim 1, which further comprises the step of forming an anchoring structure inside said middle dielectric layer which will connect between said metal bond pad layer and said underlying structure.

5. The method for fabricating a bond pad structure according to claim 1, wherein said metal bond pad layer is formed to comprise a via structure in said middle dielectric layer which is disposed underneath said bond pad layer and connects said bond pad layer with said underlying layer.

6. The method for fabricating a bond pad structure according to claim 1, wherein said island element is formed along an outer edge of said metal bond pad layer and is surrounded by an open area formed in said metal bond pad layer.

7. The method for fabricating a bond pad structure according to claim 1, wherein said island element is formed outside of said metal bond pad layer, and said metal bond pad layer is formed to contain at least one bond pad leg extending along said island element.

8. The method for fabricating a bond pad structure according to claim 1, wherein said bond frame structure contains a plurality of said island elements and an interconnected frame element.

9. The method for fabricating a bond pad structure according to claim 1, wherein said metal bond pad layer is formed to include a via structure formed in said middle dielectric layer in direct contact with said underlying layer, and said step of forming said frame element also forms a top metal layer on top of said via structure and an adjacent area of said top dielectric layer.

10. The method for fabricating a bond pad structure according to claim 1, wherein either of said first through-hole or said second through-hole, or both, is filled with a tungsten plug.

* * * * *